(12) United States Patent
Park et al.

(10) Patent No.: US 10,496,134 B2
(45) Date of Patent: Dec. 3, 2019

(54) DISPLAY DEVICE

(71) Applicant: SAMSUNG DISPLAY CO., LTD., Yongin-si, Gyeonggi-do (KR)

(72) Inventors: Jaechun Park, Yongin-si (KR); Woosong Kim, Yongin-si (KR); Kyujin Cho, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 111 days.

(21) Appl. No.: 15/711,207

(22) Filed: Sep. 21, 2017

(65) Prior Publication Data

US 2018/0088631 A1  Mar. 29, 2018

(30) Foreign Application Priority Data

Sep. 27, 2016  (KR) .................. 10-2016-0124248

(51) Int. Cl.
| | | |
|---|---|---|
| *G06F 1/16* | (2006.01) | |
| *G06F 3/041* | (2006.01) | |
| *H01L 27/32* | (2006.01) | |
| *H01L 51/52* | (2006.01) | |
| *H04M 1/02* | (2006.01) | |
| *H01L 51/00* | (2006.01) | |

(52) U.S. Cl.
CPC ............ *G06F 1/1643* (2013.01); *G06F 3/041* (2013.01); *G06F 3/0412* (2013.01); *G06F 3/0416* (2013.01); *H01L 27/3244* (2013.01); *H01L 51/5246* (2013.01); *H01L 51/5253* (2013.01); *H01L 51/5284* (2013.01); *H04M 1/0266* (2013.01); *G06F 2203/04102* (2013.01); *H01L 27/323* (2013.01); *H01L 51/0097* (2013.01); *H01L 2251/5338* (2013.01); *H04M 1/0268* (2013.01)

(58) Field of Classification Search
CPC ............................... G06F 3/041; G06F 1/1643
See application file for complete search history.

(56) References Cited

U.S. PATENT DOCUMENTS

| | | |
|---|---|---|
| 9,130,192 B2 | 9/2015 | Kim et al. |
| 2016/0062391 A1 | 3/2016 | Choi et al. |
| 2016/0093683 A1 | 3/2016 | Lee et al. |

FOREIGN PATENT DOCUMENTS

| | | |
|---|---|---|
| KR | 10-2014-0085956 A | 7/2014 |
| KR | 10-2014-0136762 A | 12/2014 |
| KR | 10-2015-0044080 A | 4/2015 |
| KR | 10-2016-0027878 A | 3/2016 |

*Primary Examiner* — Wael M Fahmy
*Assistant Examiner* — Sarah K Salerno
(74) *Attorney, Agent, or Firm* — Kile Park Reed & Houtteman PLLC

(57) ABSTRACT

A display device includes a curved plastic substrate, a display element layer over a first surface of the plastic substrate, a thin film encapsulation layer over the display element layer, a light absorption layer curved in conformity with the plastic substrate, the light absorption layer being over a second surface of the plastic substrate, the second surface being opposite to the first surface, a cushion layer over a fourth surface of the light absorption layer, a third surface of the light absorption layer facing the plastic substrate, and the fourth surface of the light absorption layer being opposite the third surface, and an electrostatic shielding layer over the cushion layer, at least one of the cushion layer and the electrostatic shielding layer has a cut pattern in a thickness direction thereof.

30 Claims, 12 Drawing Sheets

DISPLAY DEVICE

CROSS-REFERENCE TO RELATED APPLICATION

Korean Patent Application No. 10-2016-0124248, filed on Sep. 27, 2016, in the Korean Intellectual Property Office, and entitled: "Display Device," is incorporated by reference herein in its entirety.

BACKGROUND

1. Field

One or more embodiments relate to a display device.

2. Description of the Related Art

Recently, uses for display devices have diversified. Also, display devices may now be thinner and more lightweight, and thus their range of usage has gradually widened. As display devices may be utilized in various ways, various methods for designing shapes of display devices have been studied.

SUMMARY

According to one or more embodiments, a display device may include a curved plastic substrate; a display element layer over a first surface of the plastic substrate; a thin film encapsulation layer over the display element layer; a light absorption layer curved in conformity with the plastic substrate, the light absorption layer being over a second surface which is an opposite side of the first surface of the plastic substrate; a cushion layer over a fourth surface which is an opposite side of a third surface of the light absorption layer, the third surface of the light absorption layer facing the plastic substrate; and an electrostatic shielding layer over the cushion layer, wherein at least one of the cushion layer and the electrostatic shielding layer has a cut pattern in a thickness direction thereof.

The plastic substrate may include a display area being curved and corresponding to a plurality of pixels; and a non-display area surrounding the display area.

The light absorption layer may entirely overlap the display area.

An end of at least one of the light absorption layer, the cushion layer, and the electrostatic shielding layer may extend across the display area to be on the non-display area.

An end of at least one of the light absorption layer, the cushion layer, and the electrostatic shielding layer may be offset from an end of the plastic substrate.

The end of the plastic substrate may protrude further than ends of the light absorption layer, the cushion layer, and the electrostatic shielding layer.

The cut pattern may correspond to a curved portion of the light absorption layer.

Each of the cushion layer and the electrostatic shielding layer may have a cut pattern, and the cut pattern of the cushion layer may be connected to the cut pattern of the electrostatic shielding layer.

The display device may further include an adhesive layer between the second surface of the plastic substrate and the light absorption layer, the adhesive layer including debossed portions and embossed portions, the embossed portions being convex in a thickness direction of the adhesive layer toward the plastic substrate.

The adhesive layer may include an acryl-based adhesive.

The embossed portions may be island-shaped portions spaced apart from each other, and the debossed portions may be connected to each other and may respectively surround the embossed portions.

The debossed portions may be fluidly connected to outside.

The light absorption layer may include a resin material and at least one of carbon black and black ink.

The light absorption layer may include a plastic base layer; and a black layer over the plastic base layer, the black layer including at least one of the carbon black and the black ink.

The light absorption layer may include: a black resin layer in which at least of the carbon black and the black ink is mixed.

The electrostatic shielding layer may include at least one of copper and graphite.

The plastic substrate may include a first plastic layer; a second plastic layer over the first plastic layer; and an inorganic layer between the first and second plastic layers.

The electrostatic shielding layer, the cushion layer, the light absorption layer, the plastic substrate, the display element layer, and the thin film encapsulation layer may be stacked on each other in the stated order, the cut pattern extending along a direction normal to an interface between the light absorption layer and the cushion layer.

The plastic substrate may include a display area with a curved portion, the cut pattern being in a region overlapping the curved portion of the display area.

A length of the cut pattern along the thickness direction may be smaller than a combined thickness of the electrostatic shielding layer, the cushion layer, and the light absorption layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
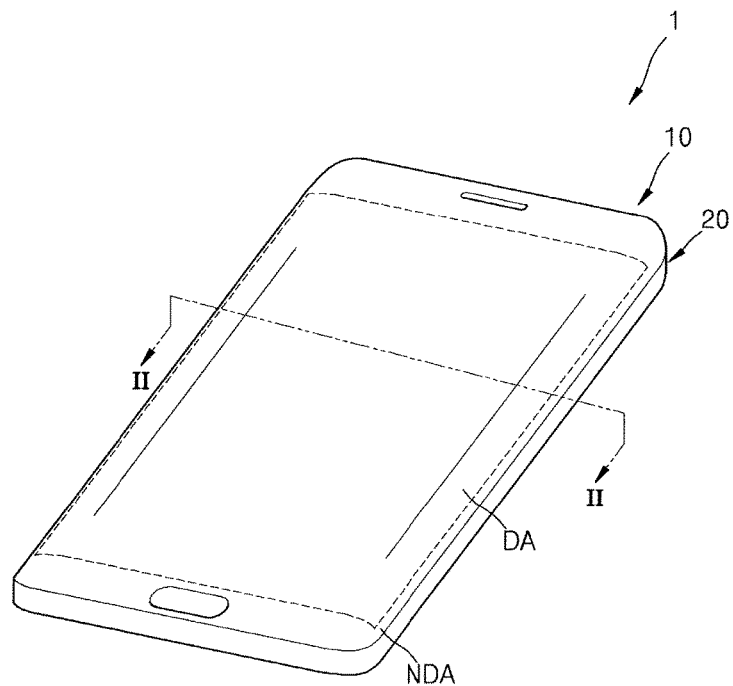
FIG. 1 illustrates a perspective view of an electronic apparatus including a display device according to an embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. It will also be understood that although the terms "first", "second", etc. may be used herein to describe various components, these components should not be limited by these terms. These components are only used to distinguish one component from another.

As used herein, the singular forms "a" "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

Figure 2:
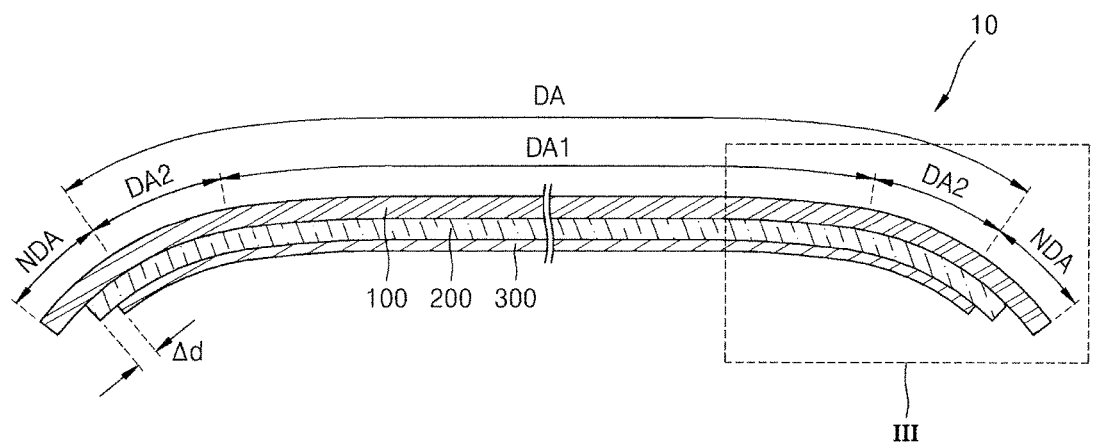
FIG. 2 illustrates a cross-sectional view of along line II-II of FIG. 1.

FIG. 1 is a perspective view of an electronic apparatus 1 including a display device according to an embodiment. FIG. 2 is a cross-sectional view of a display device according to an embodiment taken along line II-II of FIG. 1.

Referring to FIG. 1, the electronic apparatus 1 may include a display device 10 and a housing 20. The display device 10 may be assembled into, e.g., with, the housing 20. A central processor for driving the electronic apparatus 1, a battery, etc. may be inside the housing 20. The electronic apparatus 1 may be an electronic apparatus that provides a predetermined image, e.g., a mobile phone, a tablet computer, an electronic book, a smartwatch, etc., but is not limited thereto.

Referring to FIG. 2, the display device 10 may include a window cover 100, a flexible display layer 200 below the window cover 100, and a backside layer 300. For example, the flexible display layer 200 may be between the window cover 100 and the backside layer 300.

The window cover 100 includes a transparent material. The window cover 100 may include, e.g., a glass substrate or a polymer substrate. The polymer substrate may e.g., polyimide (PI), but embodiments are not limited thereto.

The window cover 100 is curved in conformity with the flexible display layer 200. In an embodiment, the window cover 100 may have a shape in which both ends of the window cover 100 are curved, as illustrated in FIG. 2. In another embodiment, the window cover 100 may have a shape in which one of both ends of the window cover 100 is curved.

The window cover 100 may extend farther than, e.g., beyond, the flexible display layer 200 and protect the flexible display layer 200. For example, the window cover 100 may have an end protruding farther than, e.g., beyond, an end of the flexible display layer 200.

The flexible display layer 200 is below the window cover 100, e.g., between the window cover 100 and the housing 20 (see FIG. 1). The flexible display layer 200 is curved. For example, the flexible display layer 200 may have a shape in which both ends are curved in conformity with the window cover 100 or may have a shape in which one of both ends is curved.

The front surface of the flexible display layer 200 may be protected by the window cover 100, and the backside of the flexible display layer 200 may be protected by the backside layer 300. The backside layer 300 is below the flexible display layer 200, e.g., between the window cover 100 and the housing 20 (see FIG. 1). The backside layer 300 is curved in conformity with the flexible display layer 200.

The flexible display layer 200 includes a display area DA and a non-display area NDA. The display area DA provides a predetermined image via a plurality of pixels. The non-display area NDA is an area not providing an image and surrounding the display area DA. The display area DA may extend up to a curved portion of the flexible display layer 200. In other words, the display area DA may include a curved portion. For example, the display area DA may include a first display area DA1, which is substantially flat, and a second display area DA2, which is curved with respect to the first display area DA1. The display area DA may provide an image via the first and second display areas DA1 and DA2.

The backside layer 300 is below the flexible display layer 200 and is curved in conformity with the flexible display layer 200. For assembly efficiency with the housing 20 described with reference to FIG. 1, the backside layer 300 may have ends shorter than the flexible display layer 200. For example, an end of the backside layer 300 may extend across the display area DA and over the non-display area NDA, and may be offset by a predetermined interval Δd from the end of the flexible display layer 200.

Figure 3:
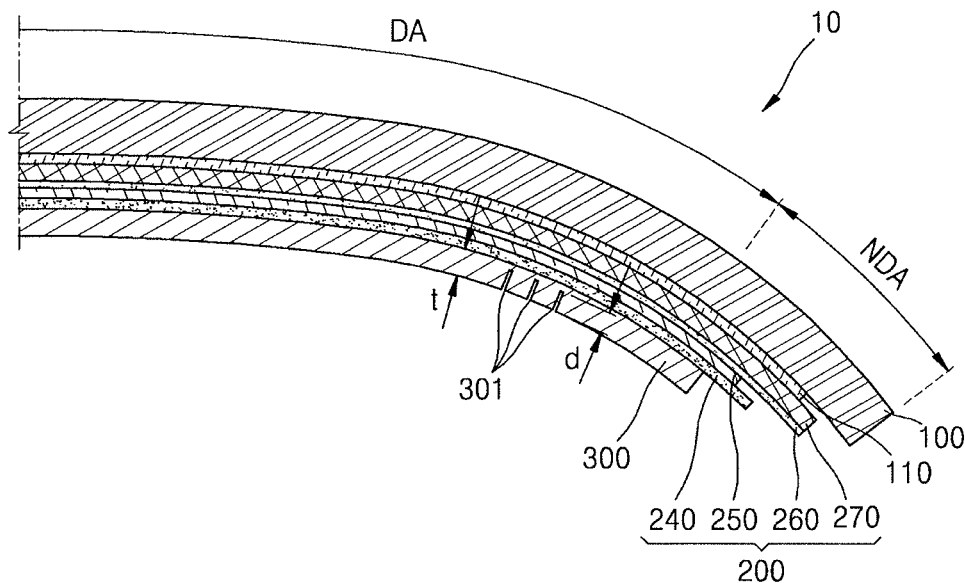
FIG. 3 illustrates an enlarged cross-sectional view of portion III in FIG. 2.
Figure 4:
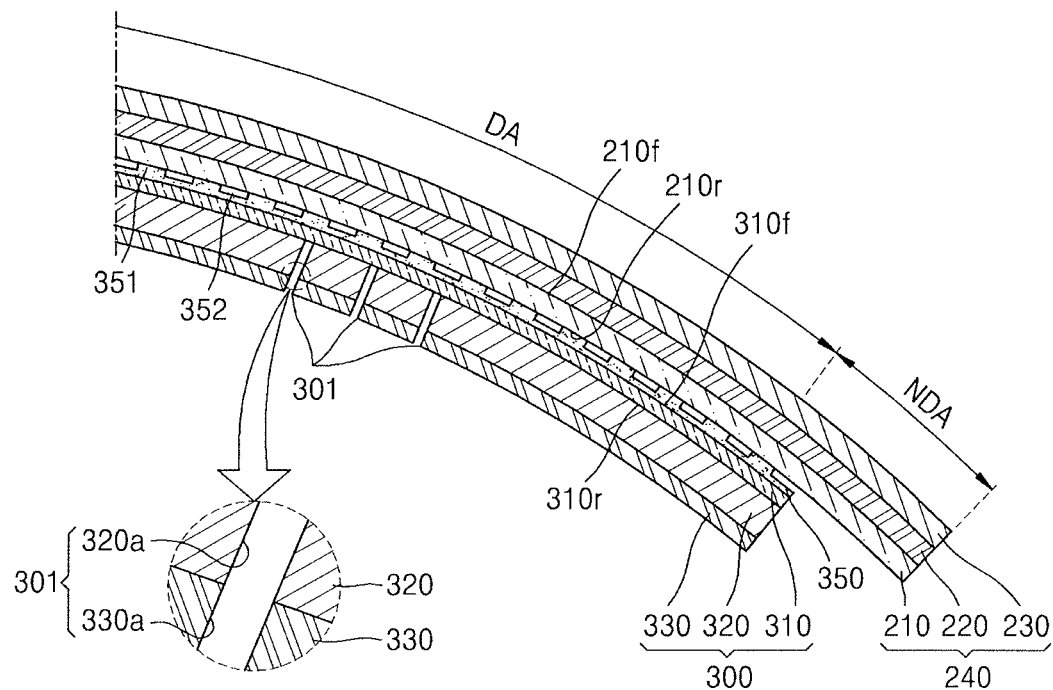
FIG. 4 illustrates an enlarged cross-sectional view of an element layer and a backside layer of FIG. 3.
Figure 5:
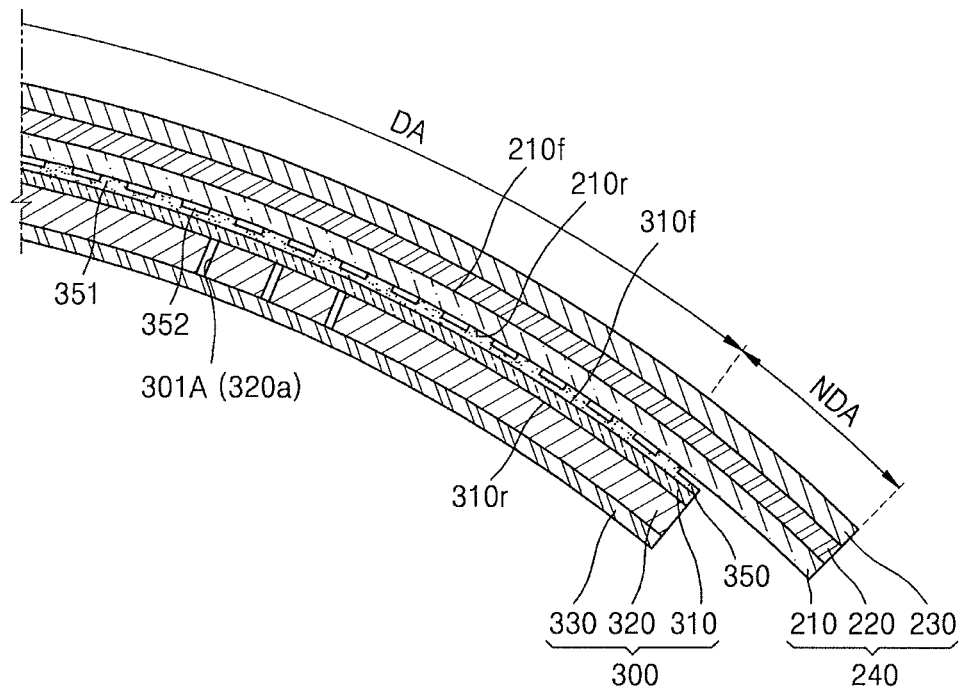
FIGS. 5 and 6 illustrate views of modifications of FIG. 4.
Figure 6:
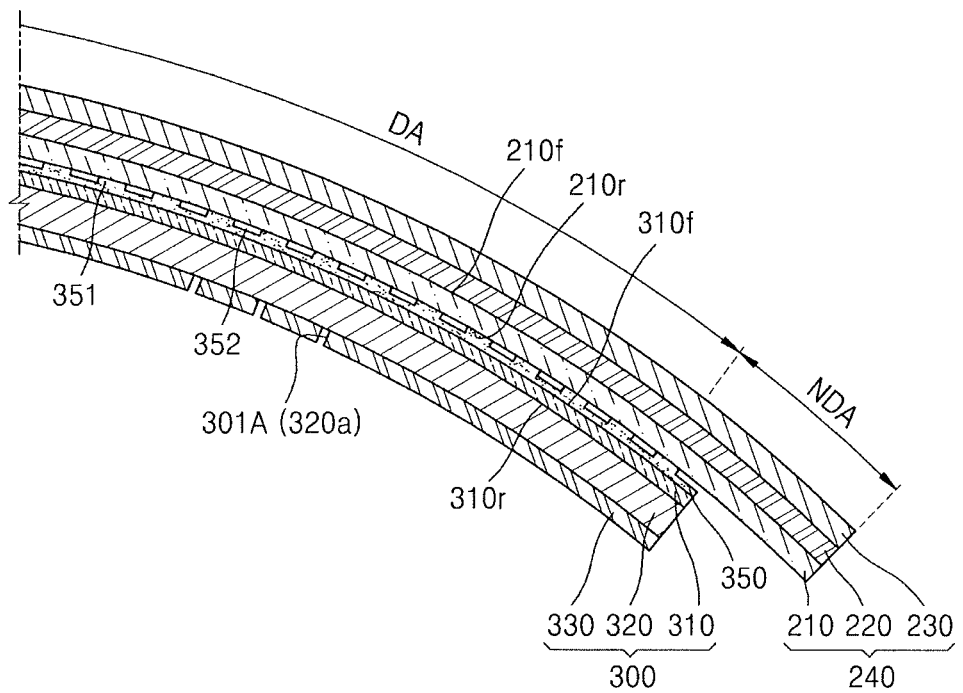

FIG. 3 is an enlarged cross-sectional view of a portion III of the display device of FIG. 2, and FIG. 4 is an enlarged cross-sectional view of an element layer and a backside layer of FIG. 3. FIGS. 5 and 6 are views of modifications of FIG. 4.

Referring to FIG. 3, the flexible display layer 200 may be adhered to the backside of the window cover 100 by using a transparent adhesive layer 110. The flexible display layer 200 may include an element layer 240, a touch layer 260, and a reflection prevention layer 270. As illustrated in FIG. 4, the element layer 240 may include a plastic substrate 210, a display element layer 220 including a display element such as an organic light-emitting diode (OLED), the display element layer 220 being over a front surface 210f (referred to as a first surface, hereinafter) of the plastic substrate 210, and a thin film encapsulation layer 230.

As illustrated in FIG. 3, the touch layer 260 may be arranged over the element layer 240 with a transparent adhesive layer 250 therebetween acting as a medium. The touch layer 260 may include electrodes detecting a touch input and may be formed over the element layer 240 by a patterning process. The reflection prevention layer 270 including a polarization plate, or a layer including a black matrix and a color filter, may be over the touch layer 260 so that outdoor visibility is secured against reflection of external light. The reflection prevention layer 270 may be formed over the element layer 240 by a patterning process.

Though FIG. 3 illustrates a structure in which the touch layer 260 is over the element layer 240 with the transparent adhesive layer 250 therebetween acting as a medium, embodiments are not limited thereto. In other embodiments, the touch layer 260 may be patterned over the element layer 240 by a deposition process, etc. In this case, the transparent adhesive layer 250 may be omitted.

As illustrated in FIG. 4, the backside layer 300 includes a light absorption layer 310, a cushion layer 320, and an electrostatic shielding layer 330.

The light absorption layer 310 includes at least one of carbon black and black ink. The light absorption layer 310 absorbs light (referred to as external light, hereinafter), which is incident toward the flexible display layer 200 from outside, e.g., outside of the window cover 100, and passes through the flexible display layer 200. Since external light is absorbed by the light absorption layer 310, external light reflection, in which external light is reflected by the backside layer 300 or the plastic substrate 210 through the flexible display layer 200 and emitted to the outside, may be prevented or substantially minimized.

The light absorption layer 310 is below a backside 210*r* (referred to as a second surface) of the plastic substrate 210 and entirely overlaps the display area DA. For example, the end of the light absorption layer 310 extends toward the end of the plastic substrate 210 across the display area DA and may be offset from the end of the plastic substrate 210 such that the end of the light absorption layer 310 is over a portion of the non-display area NDA.

The light absorption layer 310 may be over the second surface 210*r* of the plastic substrate 210 with an adhesive layer 350 therebetween as a medium. The adhesive layer 350 may include, e.g., an acryl-based adhesive. The adhesive layer 350 may include embossed portions 351 which are convex toward the plastic substrate 210 (or convex in the thickness direction of the adhesive layer 350), and debossed portions 352, which are relatively concave with respect to the embossed portions 351. The embossed portions 351 of the adhesive layer 350 may directly contact the second surface 210*r* of the plastic substrate 210, and the debossed portions 352 may be fluidly connected to the outside and may provide a path via which air is discharged when the adhesive layer 350 is attached to the plastic substrate 210. In an embodiment, the debossed portions 352 may be recessed to define openings through the adhesive layer 350.

The cushion layer 320 may be below the light absorption layer 310. For example, the cushion layer 320 may be over a backside 310*r* (referred to as a fourth surface, hereinafter) of the light absorption layer 310, which is the opposite side of a front surface 310*f* (referred to as a third surface, hereinafter) of the light absorption layer 310. The cushion layer 320 protects the flexible display layer 200 including the element layer 240 from impact. For example, while the display device 10 and the housing 20 described with reference to FIG. 1 are assembled, the cushion layer 320 may prevent the flexible display layer 200 from being damaged by the central processor, the battery, etc. arranged in the housing 20. The cushion layer 320 may include a resin material, e.g., polyurethane, polypropylene, polystyrene, acryl, and poly vinyl acetate. The cushion layer 320 may have a thickness ranging from about 50 µm to about 300 µm, but the embodiment is not limited thereto.

To improve assembly efficiency with the housing 20 (see FIG. 1), the end of the cushion layer 320 may not extend as far as the end of the plastic substrate 210. For example, the end of the cushion layer 320 may extend toward the end of the plastic substrate 210 across the display area DA and may be offset from the end of the plastic substrate 210 such that the end of the cushion layer 320 is over, e.g., only, a portion of the non-display area NDA.

The electrostatic shielding layer 330 may be below the cushion layer 320. For example, the electrostatic shielding layer 330 may be below a backside of the cushion layer 320. The electrostatic shielding layer 330 may include, e.g., graphite and/or copper. Depending on a material, the electrostatic shielding layer 330 may radiate heat emitted from the central processor, etc. received inside the flexible display layer 200 and/or the housing 20. The electrostatic shielding layer 330 may have a thickness ranging from about 30 µm to about 100 µm, but the embodiment is not limited thereto.

To improve assembly efficiency with the housing 20, the end of the electrostatic shielding layer 330 may not extend as far as the end of the plastic substrate 210. For example, the end of the electrostatic shielding layer 330 may extend toward the end of the plastic substrate 210 across the display area DA and may be offset from the end of the plastic substrate 210 such that the end of the electrostatic shielding layer 330 is over, e.g., only, a portion of the non-display area NDA.

According to an embodiment, as illustrated in FIG. 4, the light absorption layer 310, the cushion layer 320, and the electrostatic shielding layer 330 may be offset, e.g., spaced apart, from the end of the plastic substrate 210. The end of the plastic substrate 210 may protrude farther than the ends of the light absorption layer 310, the cushion layer 320, and the electrostatic shielding layer 330. In other embodiments, at least one of the light absorption layer 310, the cushion layer 320, and the electrostatic shielding layer 330 may be offset from the end of the plastic substrate 210. Even in this case, the end of the plastic substrate 210 may protrude farther than the ends of the light absorption layer 310, the cushion layer 320, and the electrostatic shielding layer 330 such that the end of the plastic substrate 210 does not limit assembly efficiency with the housing 20.

The backside layer 300 is curved in conformity with the plastic substrate 210 and includes a cut pattern 301 in a location corresponding to the curved portion of the plastic substrate 210. The cut pattern 301 is a groove in the thickness direction of the backside layer 300. As illustrated in FIG. 3, the cut pattern 301 may have a depth d less than the thickness t of the backside layer 300. Stress applied to respective layers of the backside layer 300 at the curved portion of the backside layer 300 may be distributed by the cut pattern 301.

The backside layer 300 is a film manufactured separately from the flexible display layer 200 and may be attached to the backside 210*r* of the plastic substrate 210 by using the adhesive layer 350. While the backside layer 300 is attached along the curved second surface 210*r* of the plastic substrate 210, stress is applied to interfaces between layers forming the backside layer 300. When stress is applied to a backside layer without cut patterns, the backside layer could separate from the plastic substrate, or the layers forming the backside layer may exfoliate, e.g., separate. However, since the backside layer 300 according to embodiments includes at least one cut pattern 301 at a location corresponding to the curved portion of the plastic substrate 210, separation of the backside layer 300 from the plastic substrate 210 or separation, e.g., delamination, of some of the layers forming the backside layer 300 from each other may be prevented or substantially minimized.

The cut pattern 301 which is a groove in the thickness direction of the backside layer 300 may be an opening pattern. In detail, the cut pattern 301 passes through at least one of the cushion layer 320 and the electrostatic shielding layer 330 in a thickness direction, e.g., along a direction normal to an interface between the cushion layer 320 and the electrostatic shielding layer 330, with the cushion layer 320 and the electrostatic shielding layer 330 being some of the layers forming the backside layer 300. For example, as illustrated in FIG. 4, the cut pattern 301 may, e.g., continuously, pass through both the cushion layer 320 and the electrostatic shielding layer 330 in depth dimension, such that the cushion layer 320 and the electrostatic shielding layer 330 respectively include a cut pattern 320a and a cut pattern 330a. The cut patterns 320a and 330a may be an opening pattern. The cut pattern 320a of the cushion layer 320 and the cut pattern 330a of the electrostatic shielding layer 330 correspond to, e.g., collinear with, each other and are connected to each other to form the cut pattern 301 of the backside layer 300.

In an embodiment, after the light absorption layer 310, the cushion layer 320, and the electrostatic shielding layer 330 are stacked, the cut patterns 320a and 330a may be respectively formed in the cushion layer 320 and the electrostatic shielding layer 330 by a blade, etc. The cut patterns 320a and 330a respectively of the cushion layer 320 and the electrostatic shielding layer 330 may be formed by the same blade, and the cut patterns 320a and 330a may be connected to each other and may form the cut pattern 301 of the backside layer 300.

Though FIG. 4 illustrates a case where the cut pattern 301 passes through the cushion layer 320 and the electrostatic shielding layer 330, the embodiment is not limited thereto. In other embodiments, referring to FIG. 5, a cut pattern 301A may be formed in only the cushion layer 320. That is, the cut pattern 320a of the cushion layer 320 may be the cut pattern 301A of the backside layer 300. The cut pattern 301A formed in only the cushion layer 320 may be formed by a blade, etc. before a process of forming the electrostatic shielding layer 330 or the light absorption layer 310 over the cushion layer 320. In another embodiment, referring to FIG. 6, a cut pattern 301B may be formed in only the electrostatic shielding layer 330. That is, the cut pattern 330a of the electrostatic shielding layer 330 may be the cut pattern 301B of the backside layer 300. The cut pattern 301B may be formed in only the electrostatic shielding layer 330 by the blade, etc. before the cushion layer 320, etc. is formed over the electrostatic shielding layer 330.

An effect of distributing stress may be different depending on the cut patterns 301, 301A, and 301B. A stress-distributing effect is optimal in the case where the cut pattern 301 is formed in both the cushion layer 320 and the electrostatic shielding layer 330 as illustrated in FIG. 4, is less optimal in the case where the cut pattern 301B is formed in only the electrostatic shielding layer 330 as illustrated in FIG. 6, and is less optimal still in the case where the cut pattern 301A is formed in only the cushion layer 320 as illustrated in FIG. 5.

The cut patterns 301, 301A, and 301B are not formed in the light absorption layer 310 of the backside layer 300. If the cut patterns 301, 301A, and 301B were to be formed in the light absorption layer 310, since a portion of the light absorption layer 310 that corresponds to the cut patterns 301, 301A, and 301B does not absorb external light, it would have been difficult to eliminate or minimize visibility deterioration due to external light reflection.

The cut patterns 301, 301A, and 301B of the backside layer 300 correspond to the curved portion of the light absorption layer 310, e.g., to the portion of the light absorption layer 310 in the second display area DA2. If the cut patterns 301, 301A, and 301B were not to be formed in the curved portion of the backside layer 300, and the backside layer 300 were to separate from the plastic substrate 210 via the light absorption layer 310, light would have been reflected via a gap between the plastic substrate 210 and the light absorption layer 310. Therefore, in accordance with embodiments, the cut patterns 301, 301A, and 301B correspond to the curved portion of the light absorption layer 310.

FIGS. 7A to 7H are plan views of a cut pattern according to an embodiment.

Figure 7A:
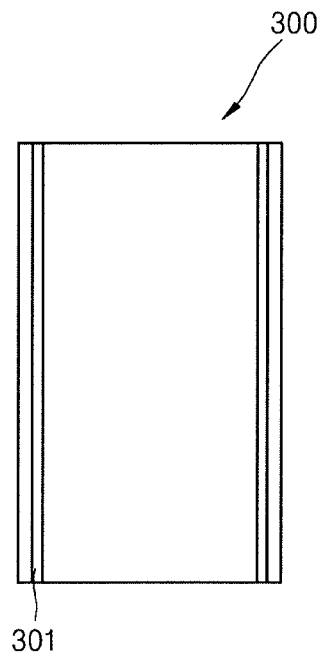
FIGS. 7A to 7H illustrate plan views of a cut pattern according to an embodiment.

Referring to FIG. 7A, the cut pattern 301 corresponds to the curved portion of the light absorption layer 310 as described above with reference to FIG. 4. The cut pattern 301 may be a straight line, e.g., a linear and continuous line along an.

Figure 7B:
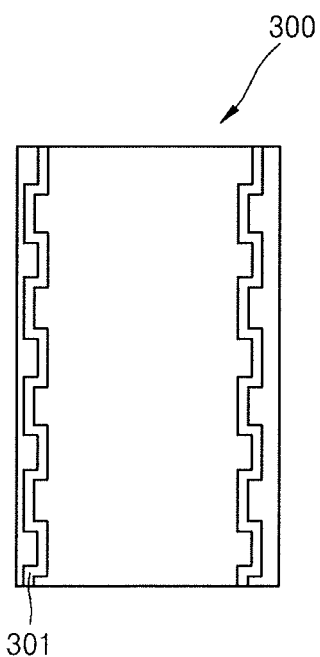
Figure 7C:
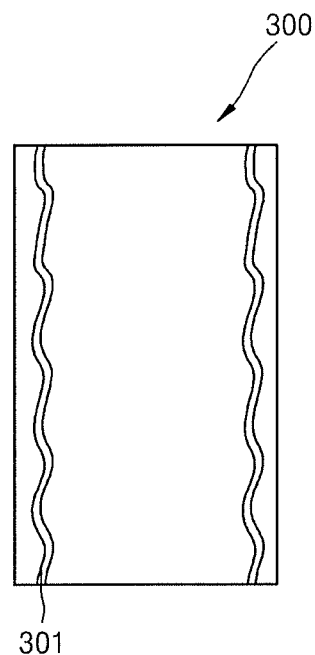

In other example embodiments, the cut pattern 301 may be non-linear. For example, the cut pattern may have a, e.g., continuous, vertical step or zigzag structure, as illustrated in FIG. 7B, or have a, e.g., continuous, vertical curved or wavy structure, as illustrated in FIG. 7C.

Figure 7D:
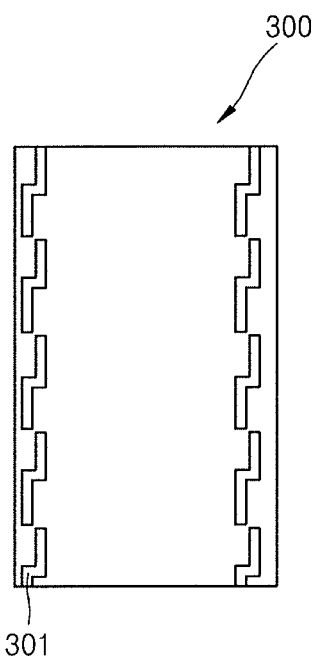
Figure 7E:
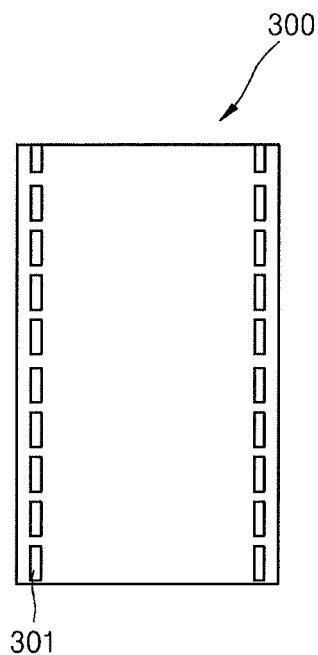
Figure 7F:
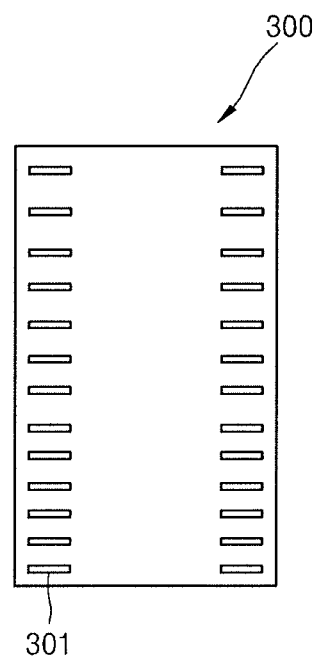
Figure 7G:
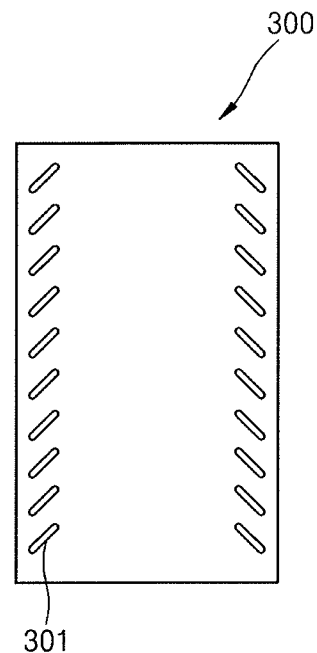
Figure 7H:
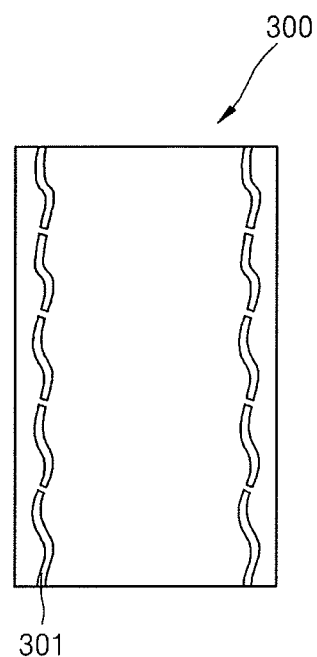

In yet other example embodiments, the cut pattern 301 may have a discontinuous structure. For example, the cut pattern may include discrete vertical step portion, as illustrated in FIG. 7D, the cut pattern may include discrete vertical openings spaced apart from each other along a thickness direction of the backside layer 300 (dashed line form), as illustrated in FIG. 7E, discrete horizontal openings spaced apart from each other along the thickness direction of the backside layer 300, as illustrated in FIG. 7F, discrete inclined openings spaced apart from each other along the thickness direction of the backside layer 300, as illustrated in FIG. 7G, or discrete vertical wavy openings spaced apart from each other along the thickness direction of the backside layer 300, as illustrated in FIG. 7H.

Though FIGS. 7A to 7H have described the cut pattern 301 of FIG. 4, the cut patterns 301A and 301B described with reference to FIGS. 5 and 6 may have the same patterns described with reference to FIGS. 7A to 7H.

Figure 8:
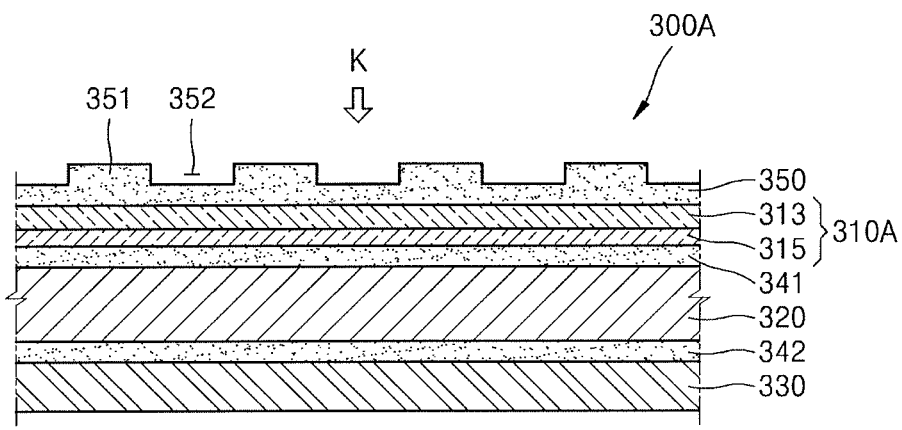
FIGS. 8 and 9 illustrate cross-sectional views of a portion of a backside layer according to another embodiment.
Figure 9:
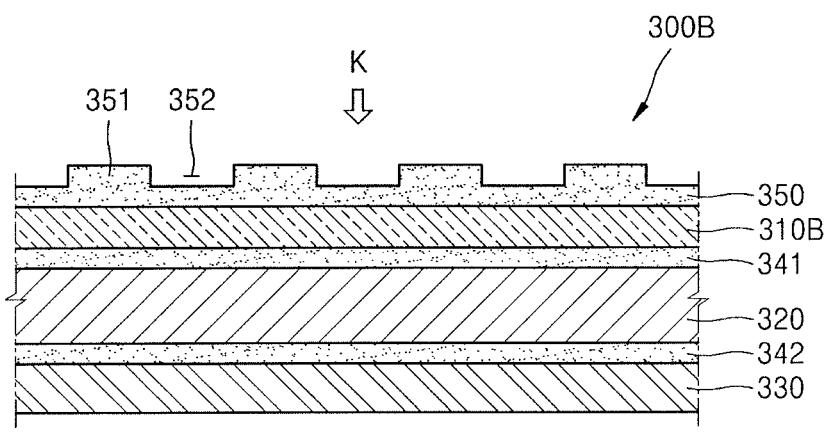

FIGS. 8 and 9 are cross-sectional views of a portion of a backside layer according to another embodiment.

Referring to FIG. 8, a backside layer 300A includes a light absorption layer 310A, the cushion layer 320, the electrostatic shielding layer 330, and the adhesive layer 350 over a third surface 310f of the light absorption layer 310A. A first adhesive layer 341 may be between the light absorption layer 310A and the cushion layer 320, and a second adhesive layer 342 may be between the cushion layer 320 and the electrostatic shielding layer 330.

Referring to FIG. 9, a backside layer 300B includes a light absorption layer 310B, the cushion layer 320, the electrostatic shielding layer 330, and the adhesive layer 350 over the third surface 310f of the light absorption layer 310B. The first adhesive layer 341 may be between the light absorption layer 310B and the cushion layer 320, and the second adhesive layer 342 may be between the cushion layer 320 and the electrostatic shielding layer 330. In an embodiment, the first and second adhesive layers 341 and 342 may include an acryl adhesive.

Since the cushion layer 320 and the electrostatic shielding layer 330 of the backside layers 300A and 300B illustrated in FIGS. 8 and 9 are the same described above with reference to FIG. 4, only differences are mainly described below.

Referring to FIG. 8, the light absorption layer 310A may include a plastic base layer 313 and a black layer 315. The plastic base layer 313 may include, e.g., polyethylene terephthalate (PET). The plastic base layer 313 may have a thickness less than about 15 μm. In an embodiment, the plastic base layer 313 may have a thickness ranging from about 1 μm to about 15 μm. The black layer 315 may be a kind of a coating layer including at least one of carbon black and black ink. The black layer 315 may have a thickness ranging from about 0.1 to about 2.5 μm.

Referring to FIG. 9, the light absorption layer 310B may be a black resin layer in which at least one of carbon black and black ink is fixed with a resin material, which is a matrix material. The resin material which is a matrix material may include a material such as PET or acryl, but the embodiment is not limited thereto. In an embodiment, the black resin layer may have a thickness ranging from about 1 μm to about 15 μm.

Figure 10A:
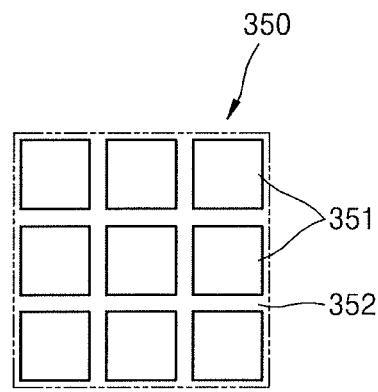
FIGS. 10A to 10C illustrate plan views of a light absorption layer viewed from K of FIGS. 8 and 9.
Figure 10B:
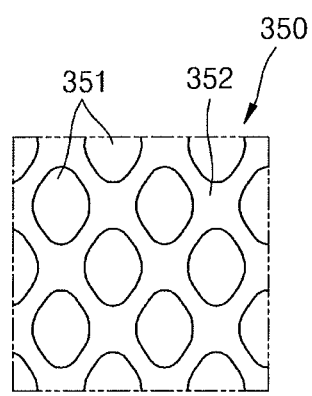
Figure 10C:
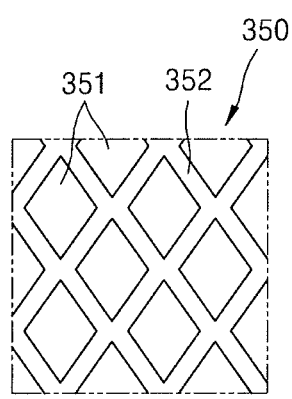

FIGS. 10A to 10C are plan views of a light absorption layer viewed from K of FIGS. 8 and 9.

Referring to FIGS. 10A to 10C, the adhesive layer 350 includes the embossed portions 351, which are convex in a thickness direction, and the debossed portions 352, which are concave with respect to the embossed portions 351. The embossed portions 351 are respectively island-shaped and are spaced apart from each other. The embossed portions 351 may be polygons, e.g., quadrangles, ellipses (or circles), and rhombuses.

The debossed portions 352 respectively surround the embossed portions 351 and are connected to each other and form a net structure, e.g., a mesh pattern. The debossed portions 352 may be fluidly connected to the outside and may provide a path via which air is discharged when the backside layer 300A or 300B is attached to the plastic substrate 210 (see FIG. 4). Therefore, attaching force between the backside layer 300A or 300B and the plastic substrate 210 may be improved, and a gap between the light absorption layer 310 and the plastic substrate 210 may not be formed, and thus a function of reducing external light reflection may be improved.

Though FIGS. 10A to 10C illustrate the adhesive layer 350 of the backside layers 300A and 300B of FIGS. 8 and 9, the embodiment is not limited thereto. The adhesive layer 350 of the backside layer 300 described above with reference to FIG. 4 may include the structure of the embossed portions 351 and the debossed portions 352 illustrated in FIGS. 10A to 10C.

Figure 11A:
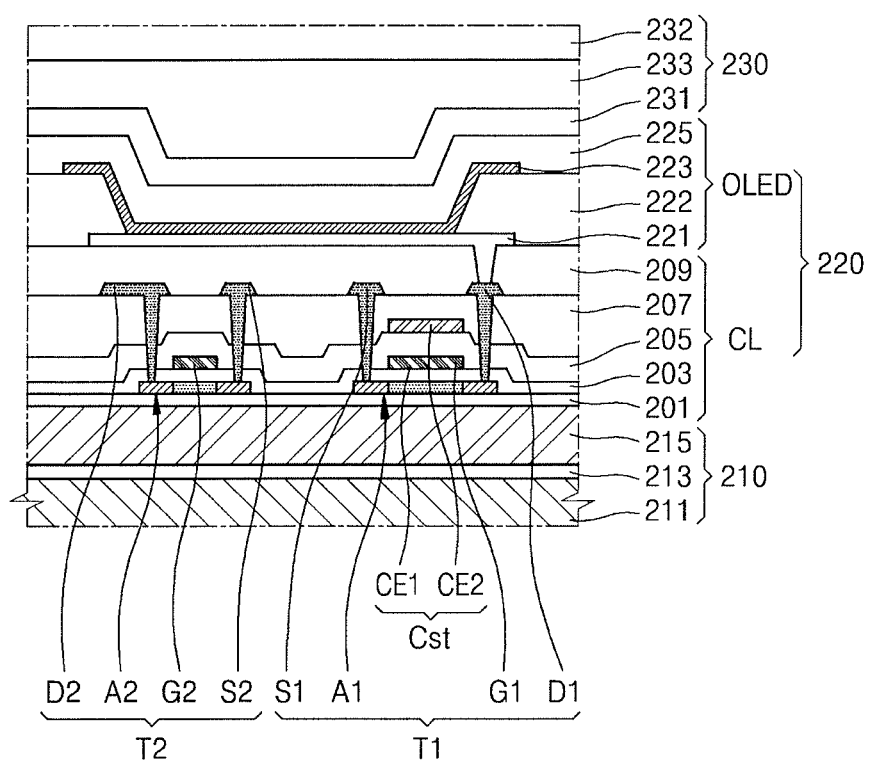
FIGS. 11A and 11B illustrate cross-sectional views of an element layer of a flexible display layer, according to an embodiment.
Figure 11B:
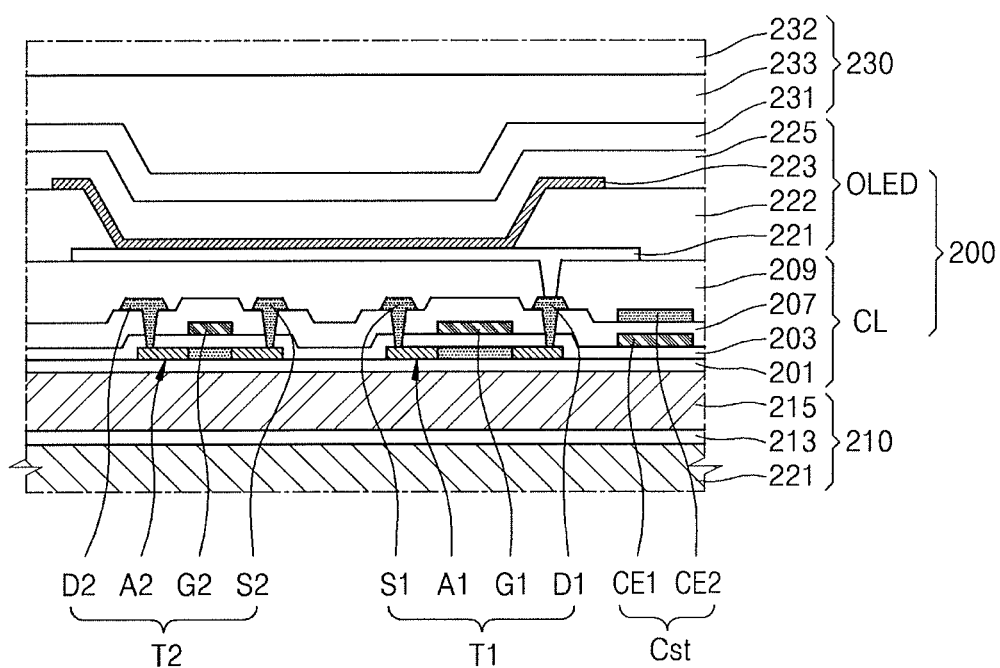

FIGS. 11A and 11B are cross-sectional views of an element layer of a flexible display layer according to an embodiment.

Referring to FIG. 11A, the element layer 240 may include the plastic substrate 210, the display element layer 220, and the thin film encapsulation layer 230.

The plastic substrate 210 may include a first plastic layer 211, a second plastic layer 215, and an inorganic layer 213 between the first and second plastic layers 211 and 215.

The first and second plastic layers 211 and 215 may include PI. Alternatively, the first and second plastic layers 211 and 215 may include polyethersulphone (PES), polyacrylate (PAR), polyether imide (PEI), polyethylene naphthalate (PEN), PET, polyphenylene sulfide (PPS), polyarylate, polycarbonate (PC), triacetylcellulose (TAC), cellulose acetate propionate (CAP), cyclic olefin polymer, cyclic olefin copolymer, etc.

The first and second plastic layers 211 and 215 may have a thickness ranging from about 3 μm to about 50 μm. In an embodiment, the first and second plastic layers 211 and 215 may have a thickness ranging from about 3 μm to about 20 μm. In another embodiment, the first and second plastic layers 211 and 215 may have a thickness ranging from about 5 μm to about 10 μm.

The inorganic layer 213 is a barrier layer preventing penetration of external foreign substances and may be a single layer or multiple layers including an inorganic material, e.g., $SiN_x$ and/or $SiO_x$. The inorganic layer 213 may have a thickness of about 6000 Å, but embodiments are not limited thereto.

The display element layer 220 may be over the plastic substrate 210 and may include a pixel circuit CL and an OLED. The pixel circuit CL includes a driving thin film transistor T1, a switching thin film transistor T2, and a storage capacitor Cst.

The driving thin film transistor T1 may include a driving semiconductor layer A1, a driving gate electrode G1, a driving source electrode S1, and a driving drain electrode D1. The switching thin film transistor T2 may include a switching semiconductor layer A2, a switching gate electrode G2, a switching source electrode S2, and a switching drain electrode D2. The storage capacitor Cst may include a first storage plate CE1 and a second storage plate CE2.

A buffer layer 201 is between the plastic substrate 210 and the driving and switching semiconductor layers A1 and A2. A gate insulating layer 203 is between the driving and switching semiconductor layers A1 and A2 and the driving and switching gate electrodes G1 and G2. A dielectric layer 205 is between the first and second storage plates CE1 and CE2. An interlayer insulating layer 207 is between the driving and switching gate electrodes G1 and G2 and the driving and switching source/drain electrodes S1, D1, S2, and D2. An insulating layer 209 is over the driving and switching source/drain electrodes S1, D1, S2, and D2.

The buffer layer 201 and the gate insulating layer 203 may be a single layer or multiple layers including an inorganic material, e.g., $SiN_x$ and/or $SiO_x$. The dielectric layer 205 may be a single or multiple layers including an inorganic material, e.g., $SiN_x$, $SiO_x$, and/or $Al_2O_3$. The insulating layer 209 may include an organic material including a general-purpose polymer, e.g., polymethylmethacrylate (PMMA) or polystyrene (PS), or polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. However, embodiments are not limited thereto.

The OLED includes a pixel electrode 221, an emission layer 223, and an opposite electrode 225. The pixel electrode 221 is exposed via a pixel-defining layer 222. The pixel-defining layer 222 may cover the edges of the pixel electrode 221. The pixel-defining layer 222 may include an organic insulating material and an inorganic insulating material, or include only an organic insulating material or include only an inorganic insulating material.

The pixel electrode 221 is over the insulating layer 209 which is a planarization layer. The pixel electrode 221 may be a transparent conductive oxide (TCO) layer. Alternatively, the pixel electrode 221 may be a thin metallic film including Ag or an Ag alloy, or may be multiple layers including a TCO layer over the thin metallic film. In an embodiment, the pixel electrode 221 may be a triple layer of ITO/Ag/ITO respectively having thicknesses of 70 Å/850 Å/50 Å.

The emission layer 223 includes an organic material emitting red, green, or blue light and overlaps the pixel electrode 221 exposed via the pixel-defining layer 222. At least one of a hole transport layer (HTL), a hole injection layer (HIL), an electron transport layer (ETL), and an electron injection layer (EIL) may be selectively below and/or over the emission layer 223.

The opposite electrode 225 may be one body covering the plastic substrate 210 entirely. The opposite electrode 225 may be a semi-transmissive thin metallic layer including at least one of metals having a small work function, e.g., Li, Ca, LiF/Ca, LiF/Al, Al, Mg, Ag, and an alloy of Ag and Mg. Alternatively, the opposite electrode 225 may include the semi-transmissive thin metallic layer and a TCO layer, e.g., ITO, IZO, ZnO, $In_2O_3$, IGO, or AZO over the semi-transmissive thin metallic layer.

The thin film encapsulation layer 230 includes at least one inorganic layer and at least one organic layer. For example, the thin film encapsulation layer 230 may include a first inorganic layer 231, a second inorganic layer 232, and an organic layer 233 between the first and second inorganic layers 231 and 232.

The first and second inorganic layers 231 and 232 may include, e.g., AlN, $Al_2O_3$, TiN, $TiO_2$, SiON, $SiN_x$, $SiO_x$, etc. The first and second inorganic layers 231 and 232 may protect the opposite electrode 225, the emission layer 223, etc. from moisture, etc.

The organic layer 233 may include a polymer-based material, e.g., PMMA, PC, PS, an acryl-based resin, an epoxy-based resin, PI, polyethylene, etc. The organic layer 233 may be thicker than the first and second inorganic layers 231 and 232. The organic layer 233 may relieve internal stress of the first and second inorganic layers 231 and 232, complement defects of the first and second inorganic layers 231 and 232, and planarize the first and second inorganic layers 231 and 232.

Though a case where the above-described thin film encapsulation layer 230 includes two inorganic layers and one organic layer therebetween has been described, the embodiment is not limited thereto. The number of inorganic layers and organic layers, and a stacking sequence thereof may be variously selected.

FIG. 11A illustrates a structure in which the storage capacitor Cst overlaps the driving thin film transistor T1. That is, though the driving gate electrode G1 also serves as the first storage plate CE1, the embodiment is not limited thereto.

Referring to FIG. 11A, the storage capacitor Cst may not overlap the driving thin film transistor T1. The first storage plate CE1 and the driving gate electrode G1 include the same material. The second storage plate CE2 and the driving source and drain electrodes S1 and D1 include the same material. The gate insulating layer 203 may be between the first and second storage plates CE1 and CE2.

Figure 12:
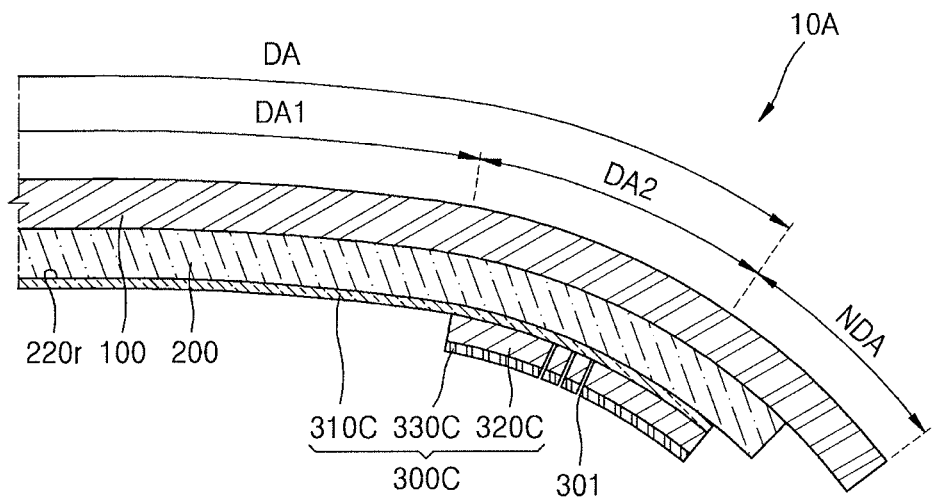
FIG. 12 illustrates a cross-sectional view of a portion of a display device according to another embodiment.

FIG. 12 is a cross-sectional view of a portion of a display device according to another embodiment.

Though FIGS. 2 to 4 illustrate a case where the light absorption layer 310, the cushion layer 320, and the electrostatic shielding layer 330 of the display device 10 are entirely below the backside of the flexible display layer 200, the embodiment is not limited thereto.

Referring to FIG. 12, a display device 10A includes the window cover 100, the flexible display layer 200 being curved and below the window cover 100, and a backside layer 300C. Since the window cover 100 and the flexible display layer 200 are the same as those described with reference to FIGS. 2 to 4 and 11A and 11B, only differences are mainly described below.

The backside layer 300C may include a light absorption layer 310C, a cushion layer 320C, and an electrostatic shielding layer 330C. The light absorption layer 310C is curved in conformity with a curved second surface 220r of the flexible display layer 200 as described above. The light absorption layer 310C may selectively include the same structure as those of each of the light absorption layers 310, 310A, and 310B described with reference to FIGS. 4, 8, and 9, and thus, a description thereof is omitted.

In an embodiment, the light absorption layer 310C entirely overlaps the display area DA of the flexible display layer 200 but the cushion layer 320C and the electrostatic shielding layer 330C may correspond to only the curved portions of the flexible display layer 200. That is, only the light absorption layer 310C is over a portion of the second surface 210r of the flexible display layer 200 corresponding to a relatively flat first display area DA1, and the cushion layer 320C and the electrostatic shielding layer 330C may not be over the portion of the second surface 210r of the flexible display layer 200 corresponding to the relatively flat first display area DA1.

The cushion layer 320C and the electrostatic shielding layer 330C may correspond to the curved portion of the flexible display layer 200. To distribute stress, at least one of the cushion layer 320C and the electrostatic shielding layer 330C may include the cut pattern 301. Since the material, the thickness, etc. of the cushion layer 320C and the electrostatic shielding layer 330C are the same as those described above with reference to FIG. 4, descriptions thereof are omitted.

Figure 13:
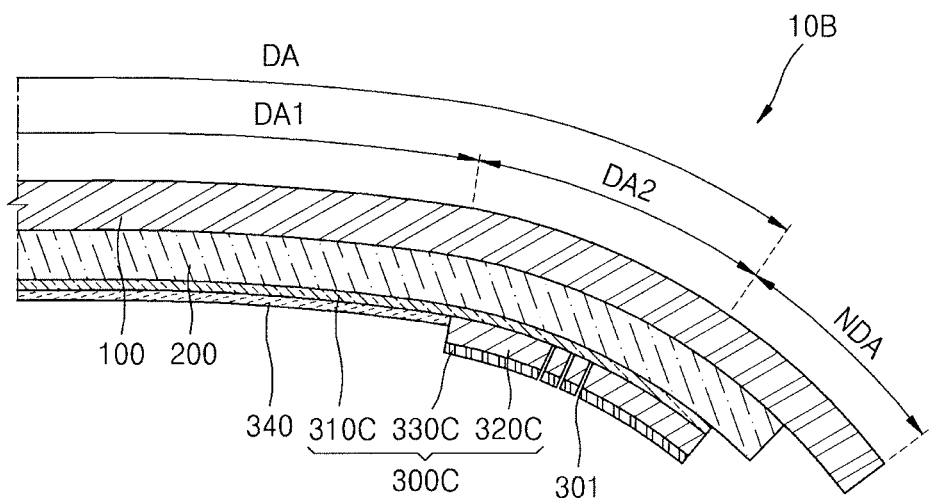
FIG. 13 illustrates a view of a modification of FIG. 12.

FIG. 13 is a view of a modification of FIG. 12.

Referring to FIG. 13, a display device 10B may further include an additional electrostatic shielding layer 340 over a portion of the light absorption layer 310C corresponding to the first display area DA1.

The additional electrostatic shielding layer 340 may include the same material as that of the electrostatic shielding layer 330C or include a material different from that of the electrostatic shielding layer 330C. For example, the additional electrostatic shielding layer 340 may include a material such as graphite and/or copper.

Though FIG. 13 illustrates a case where the additional electrostatic shielding layer 340 is separated from the electrostatic shielding layer 330C, the additional electrostatic shielding layer 340 may be connected to the electrostatic shielding layer 330C according to another embodiment.

Though FIGS. 12 and 13 illustrate a case where the cushion layer 320C and the electrostatic shielding layer 330C overlap only the second display area DA2 from among the first display area DA1 and the second display area DA2, this is merely provided as an example, and thus, the embodiment is not limited thereto. In an embodiment, the ends of the cushion layer 320C and the electrostatic shielding layer 330C that are adjacent to the first display area DA1 may extend further into the first display area DA1.

By way of summation and review, one or more embodiments include a structure of a curved display device. That is, a display device according to embodiments may improve assembly efficiency by resolving partial exfoliation of layers of a backside layer and may improve display quality by reducing reflectivity of external light.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
    a curved plastic substrate;
    a display element layer over a first surface of the plastic substrate;
    a thin film encapsulation layer over the display element layer;
    a light absorption layer curved in conformity with the plastic substrate, the light absorption layer being over a second surface of the plastic substrate, the second surface being opposite to the first surface;
    a cushion layer over a fourth surface of the light absorption layer, a third surface of the light absorption layer facing the plastic substrate, and the fourth surface of the light absorption layer being opposite the third surface; and
    an electrostatic shielding layer over the cushion layer,
    wherein at least one of the cushion layer and the electrostatic shielding layer has a cut pattern in a thickness direction thereof.

2. The display device as claimed in claim 1, wherein the plastic substrate includes:
    a display area including a plurality of pixels, the display area having a curved portion; and
    a non-display area surrounding the display area.

3. The display device as claimed in claim 2, wherein the light absorption layer entirely overlaps the display area.

4. The display device as claimed in claim 2, wherein an end of at least one of the light absorption layer, the cushion layer, and the electrostatic shielding layer extends across the display area to be on the non-display area.

5. The display device as claimed in claim 1, wherein an end of at least one of the light absorption layer, the cushion layer, and the electrostatic shielding layer is offset from an end of the plastic substrate.

6. The display device as claimed in claim 5, wherein the end of the plastic substrate protrudes further than ends of the light absorption layer, the cushion layer, and the electrostatic shielding layer.

7. The display device as claimed in claim 1, wherein the cut pattern corresponds to a curved portion of the light absorption layer.

8. The display device as claimed in claim 1, wherein each of the cushion layer and the electrostatic shielding layer has a cut pattern, and the cut pattern of the cushion layer is connected to the cut pattern of the electrostatic shielding layer.

9. The display device as claimed in claim 1, further comprising an adhesive layer between the second surface of the plastic substrate and the light absorption layer, the adhesive layer including debossed portions and embossed portions, the embossed portions being convex in a thickness direction of the adhesive layer toward the plastic substrate.

10. The display device as claimed in claim 9, wherein the adhesive layer includes an acryl-based adhesive.

11. The display device as claimed in claim 9, wherein the embossed portions are island-shaped portions spaced apart from each other, and the debossed portions are connected to each other and respectively surround the embossed portions.

12. The display device as claimed in claim 9, wherein the debossed portions are fluidly connected to outside.

13. The display device as claimed in claim 1, wherein the light absorption layer includes a resin material and at least one of carbon black and black ink.

14. The display device as claimed in claim 13, wherein the light absorption layer includes:
    a plastic base layer; and
    a black layer over the plastic base layer, the black layer including at least one of the carbon black and the black ink.

15. The display device as claimed in claim 13, wherein the light absorption layer includes a black resin layer in which at least one of the carbon black and the black ink is mixed.

16. The display device as claimed in claim 1, wherein the electrostatic shielding layer includes at least one of copper and graphite.

17. The display device as claimed in claim 1, wherein the plastic substrate includes:
    a first plastic layer;
    a second plastic layer over the first plastic layer; and
    an inorganic layer between the first and second plastic layers.

18. The display device as claimed in claim 1, wherein the electrostatic shielding layer, the cushion layer, the light absorption layer, the plastic substrate, the display element layer, and the thin film encapsulation layer are stacked on each other in the stated order, the cut pattern extending along a direction normal to an interface between the light absorption layer and the cushion layer.

19. The display device as claimed in claim 1, wherein the plastic substrate includes a display area with a curved portion, the cut pattern being in a region overlapping the curved portion of the display area.

20. The display device as claimed in claim 1, wherein a length of the cut pattern along the thickness direction is smaller than a combined thickness of the electrostatic shielding layer, the cushion layer, and the light absorption layer.

21. A flexible display device, comprising:
    a plastic substrate including a first surface and a second surface opposite to the first surface;
    a display element layer over the first surface of the plastic substrate;
    a thin film encapsulation layer over the display element layer;
    a cushion layer over the second surface of the plastic substrate; and
    an electrostatic shielding layer on the cushion layer such that the cushion layer is between the plastic substrate and the electrostatic shielding layer, wherein the electrostatic shielding layer has at least two parts which are separated from each other with a gap therebetween.

22. The display device as claimed in claim 21, wherein the plastic substrate comprises at least one selected from polyimide (PI), polyethersulphone (PES), polyacrylate (PAR), polyether imide (PEI), polyethylene naphthalate (PEN), polyethylene terephthalate (PET), polyphenylene sulfide (PPS), polyarylate, polycarbonate (PC), triacetylcellulose (TAC), cellulose acetate propionate (CAP), cyclic olefin polymer, and cyclic olefin copolymer.

23. The display device as claimed in claim 21, wherein the cushion substrate comprises a resin material.

24. The display device as claimed in claim 21, wherein the gap of the electrostatic shielding layer extends along a direction.

25. The display device as claimed in claim 24, wherein the gap of the electrostatic shielding layer has a depth which is the same as a thickness of the electrostatic shielding layer.

26. The display device as claimed in claim 21, wherein the electrostatic shielding layer comprises a metal material.

27. The display device as claimed in claim 21, further comprises a light absorption layer between the plastic substrate and the cushion layer.

28. The display device as claimed in claim 21, further comprises a touch layer on the thin film encapsulation layer, and the touch layer includes a plurality of electrodes configured to sense a touch input.

29. The display device as claimed in claim 21, further comprises a reflection prevention layer on the thin film encapsulation layer.

30. The display device as claimed in claim 29, wherein the reflection prevention layer includes a polarization plate, or a layer including a black matrix and a color filter.

* * * * *